United States Patent
Wu et al.

(10) Patent No.: US 10,875,060 B2
(45) Date of Patent: Dec. 29, 2020

(54) METHOD AND APPARATUS FOR REMOVING DEBRIS FROM COLLECTOR

(71) Applicant: TAIWAN SEMICONDUCTOR MANUFACTURING CO., LTD., Hsinchu (TW)

(72) Inventors: Shang-Ying Wu, Hsinchu County (TW); Ming-Hsun Tsai, Hsinchu (TW); Sheng-Kang Yu, Hsinchu (TW); Yung-Teng Yu, Hsinchu County (TW); Chi Yang, Taichung (TW); Shang-Chieh Chien, New Taipei (TW); Chia-Chen Chen, Hsinchu (TW); Li-Jui Chen, Hsinchu (TW); Po-Chung Cheng, Chiayi County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/388,387

(22) Filed: Apr. 18, 2019

(65) Prior Publication Data
US 2020/0331038 A1    Oct. 22, 2020

(51) Int. Cl.
| B08B 7/04 | (2006.01) |
| B08B 3/10 | (2006.01) |
| H05G 2/00 | (2006.01) |
| B08B 7/00 | (2006.01) |
| B08B 3/08 | (2006.01) |
| B08B 5/04 | (2006.01) |
| G02B 23/24 | (2006.01) |

(52) U.S. Cl.
CPC ............... *B08B 7/04* (2013.01); *B08B 3/08* (2013.01); *B08B 3/10* (2013.01); *B08B 5/04* (2013.01); *B08B 7/0028* (2013.01); *G02B 23/24* (2013.01); *H05G 2/008* (2013.01)

(58) Field of Classification Search
CPC ............ G03F 7/70033; G03F 7/70916; G03F 7/70925; G03F 7/70908; G03F 7/0027; G03F 7/70983; H05G 2/005; H05G 2/008; G02B 27/0006
USPC ........ 250/504 R, 503.1, 358.1, 461.1, 493.1; 355/30; 359/509
See application file for complete search history.

(56) References Cited

U.S. PATENT DOCUMENTS

| 2004/0165171 A1* | 8/2004 | Tran ................... G03F 7/70983 355/71 |
| 2004/0184014 A1* | 9/2004 | Bakker ................. B82Y 10/00 355/30 |
| 2009/0289205 A1* | 11/2009 | Moriya ............... G03F 7/70575 250/504 R |
| 2014/0306115 A1* | 10/2014 | Kuritsyn ................ H05G 2/008 250/358.1 |

(Continued)

*Primary Examiner* — David A Vanore
(74) *Attorney, Agent, or Firm* — Maschoff Brennan

(57) ABSTRACT

Debris is removed from a collector of an extreme ultraviolet light source vessel by applying a suction force through a vacuum opening of a cable. The method for removing debris also includes weakening debris attachment by using a sticky surface or by spreading a solution through a nozzle, wherein the sticky surface and the nozzle are arranged on the cable proximal to the vacuum opening. A borescope system and interchangeable rigid portions of the cable assists in targeting a target area of the collector where the debris is.

20 Claims, 12 Drawing Sheets

(56) References Cited

U.S. PATENT DOCUMENTS

| | | | |
|---|---|---|---|
| 2015/0085264 A1* | 3/2015 | Chien | G03F 7/70916 |
| | | | 355/30 |
| 2018/0173117 A1* | 6/2018 | Chien | G03F 7/70175 |
| 2018/0317308 A1* | 11/2018 | Chang | H01S 3/1305 |
| 2019/0033225 A1* | 1/2019 | Chang | G03F 7/70175 |
| 2019/0094718 A1* | 3/2019 | Yang | G03F 7/70533 |
| 2019/0150266 A1* | 5/2019 | Lai | G03F 7/70033 |
| | | | 250/504 R |
| 2019/0155179 A1* | 5/2019 | Wu | G03F 7/70175 |
| 2019/0335571 A1* | 10/2019 | Wu | H05G 2/006 |
| 2019/0369481 A1* | 12/2019 | Lee | G03F 7/7015 |
| 2020/0008290 A1* | 1/2020 | Su | G03F 7/70033 |
| 2020/0037427 A1* | 1/2020 | Yang | G03F 7/70925 |
| 2020/0041783 A1* | 2/2020 | Liu | G02B 27/0006 |
| 2020/0041908 A1* | 2/2020 | Yen | G03F 7/70916 |
| 2020/0057181 A1* | 2/2020 | Yang | G03F 7/70916 |
| 2020/0057393 A1* | 2/2020 | Yang | G03F 7/70033 |
| 2020/0103433 A1* | 4/2020 | Lai | G02B 27/0006 |
| 2020/0103758 A1* | 4/2020 | Chen | G03F 7/2002 |
| 2020/0107426 A1* | 4/2020 | Cheng | H05G 2/006 |
| 2020/0133136 A1* | 4/2020 | Chen | G03F 7/70033 |
| 2020/0166848 A1* | 5/2020 | Tsai | H05G 2/006 |

\* cited by examiner

US 10,875,060 B2

METHOD AND APPARATUS FOR REMOVING DEBRIS FROM COLLECTOR

BACKGROUND

Photolithography is a process by which a photomask having a pattern is irradiated with light to transfer the pattern onto a photosensitive material overlying a semiconductor substrate. Over the history of the semiconductor industry, smaller integrated chip minimum features sizes have been achieved by reducing the exposure wavelength of optical lithography radiation sources to improve photolithography resolution. Extreme ultraviolet (EUV) lithography, which uses extreme ultraviolet (EUV) light having an exposure wavelength of between 10 nm and 130 nm, is a promising next-generation lithography solution for emerging technology nodes. Extreme ultraviolet light source vessels are used to produce the extreme ultraviolet light in EUV lithography. However, during operation debris from fuel droplets are often left on a collector inside the extreme ultraviolet light source vessel, which affects the ability of the collector to reflect the generated extreme ultraviolet light.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
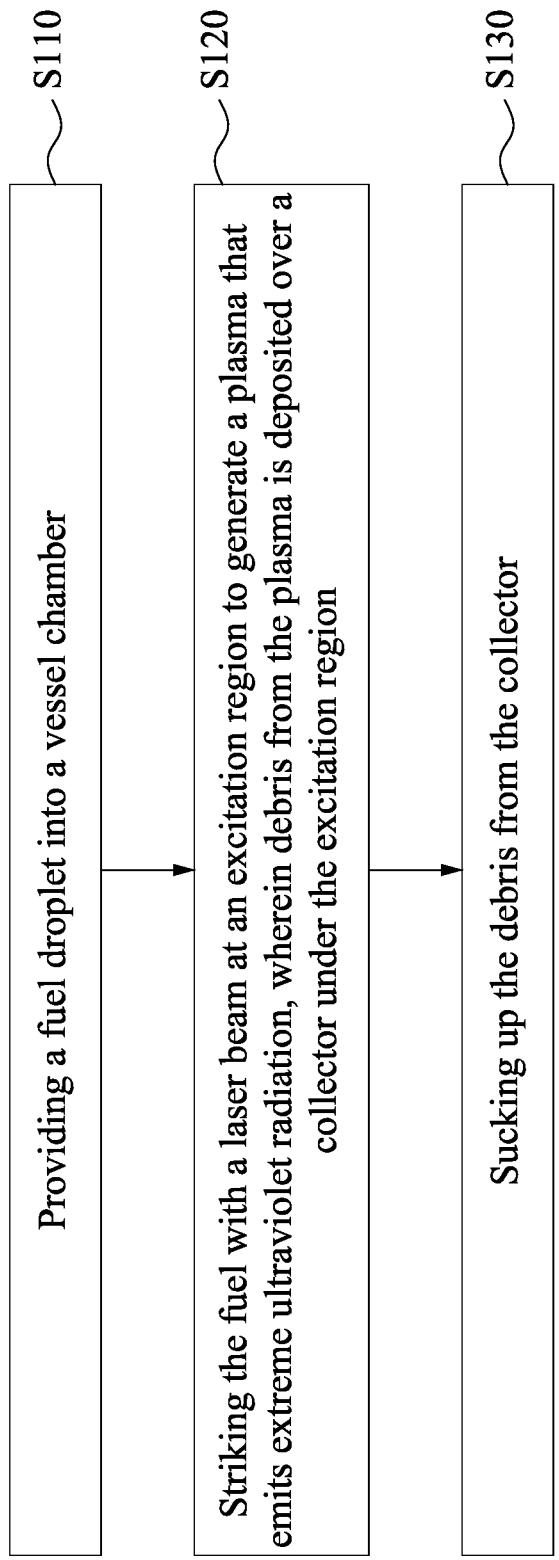
FIG. 1 shows a flowchart of a method for removing debris from a collector according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

In extreme ultraviolet photolithography, extreme ultraviolet light is generated and used to image patterns onto photoresist layers. Maintaining a constant and continued operation of an extreme ultraviolet light source vessel increases the efficiency and cost-effectiveness of the photolithography process.

FIG. 1 shows a flowchart of a method for removing debris from a collector according to some embodiments of the present disclosure. Referring to FIG. 1, in some embodiments of the present disclosure, a method begins with block S110 in which a fuel droplet is provided into a vessel chamber (e.g. extreme ultraviolet light source vessel). The method continues with block S120 in which the fuel is struck with a laser beam at an excitation region to generate a plasma that emits extreme ultraviolet radiation, and debris from the plasma is deposited over a collector under the excitation region. The method continues with block S130 in which the debris is sucked up from the collector. While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 2:
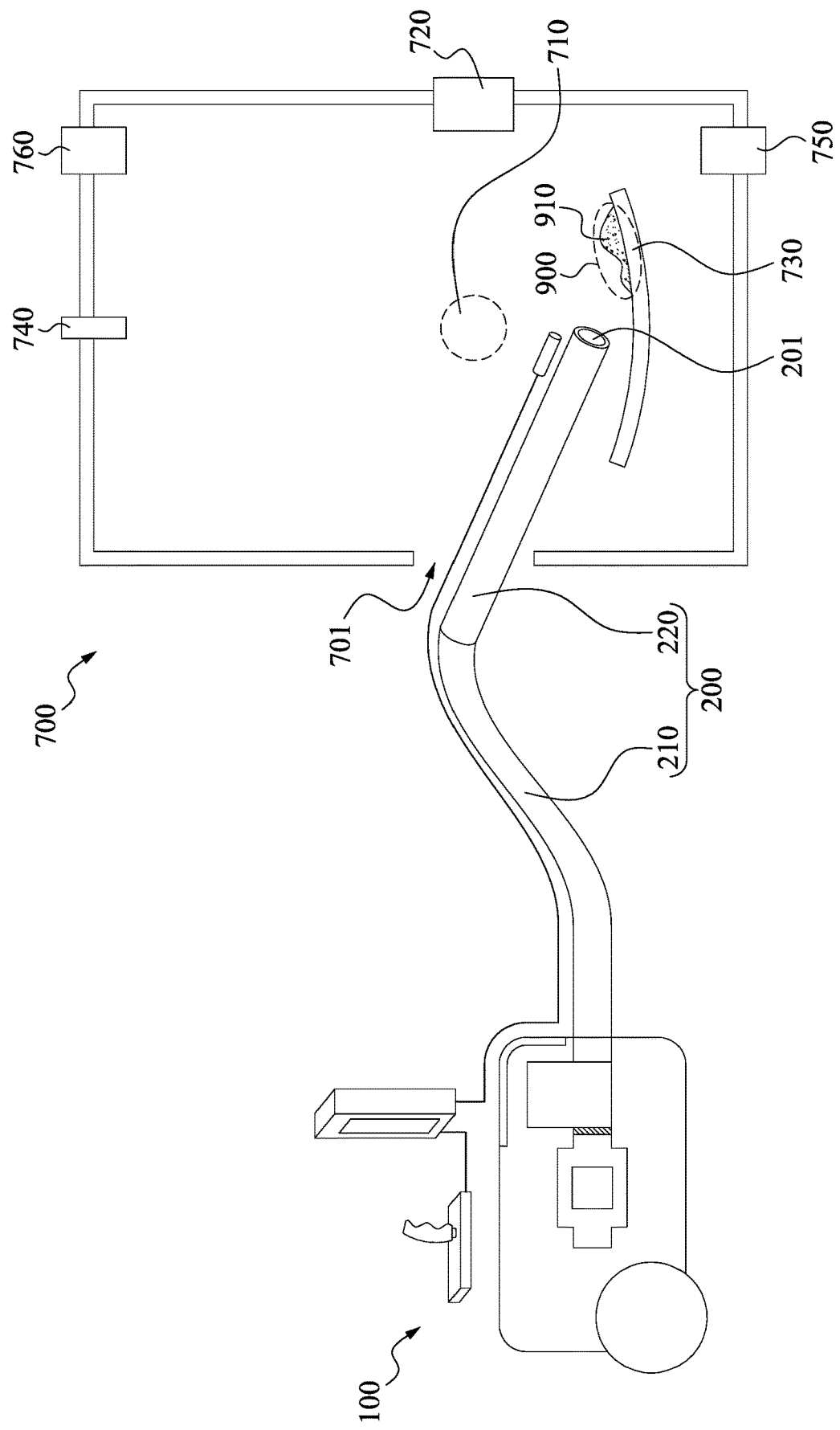
FIG. 2 shows a schematic diagram of an apparatus for removing debris from a collector and a vessel chamber according to some embodiments of the present disclosure.

FIG. 2 shows a schematic diagram of an apparatus 100 of removing debris 910 from a collector 730 and a vessel chamber 700 according to some embodiments of the present disclosure. Referring to FIG. 2, the collector 730 and an intermediate focus 740 are arranged inside the vessel chamber 700 of an extreme ultraviolet light source vessel, and at two opposite sides of an excitation region 710 where fuel droplets are excited by a laser beam to produce extreme ultraviolet radiation. The collector 730 is arranged at the bottom of the vessel chamber 700, and is configured to reflect the extreme ultraviolet light produced by the excited fuel droplets at the excitation region 710 toward the intermediate focus 740. The collector 730 is coated with a multilayer reflector including alternating layers of different materials. The alternating layers of materials are configured to reflect extreme ultraviolet light by interlayer interference. Specifically, the thicknesses of the layers are chosen such that extreme ultraviolet light reflected at the layers constructively interfere with each other. The intermediate focus 740 is arranged at the top of the vessel chamber 700. Some of the fuel droplets fall on the collector 730 and become the debris 910.

In some embodiments, the fuel droplet provided into the extreme ultraviolet light source vessel is a tin droplet. For example, tin is heated in a droplet generator above the melting point (e.g., about 231.9° C.) of tin and liquefied. The liquefied tin is ejected by high pressure through a narrow nozzle of the droplet generator such that liquid tin droplets fly toward the excitation region 710 in the vessel chamber 700 of the extreme ultraviolet light source vessel. In order to provide tin droplets having stable paths, the pressure applied by the droplet generator is kept at a constant such that the exit velocity of the tin droplets from the droplet generator is stable.

Moreover, the fuel droplets are illuminated by a laser beam at the excitation region 710. As a fuel droplet is heated by the laser beam, a laser produced plasma which is hot and dense is created, and extreme ultraviolet radiation is emitted from the laser produced plasma due to the excitation. As a result, extreme ultraviolet radiation is generated inside the vessel chamber 700 of the extreme ultraviolet light source vessel. In some embodiments, the generated extreme ultraviolet radiation has a wavelength in a range from about 10 nanometers to about 17 nanometers, thereby reducing the critical dimension (i.e. minimum feature size that can be printed) of the lithography process compared to immersion lithography. Since extreme ultraviolet radiation is absorbed by most matter, the vessel chamber is preferably a vacuum environment during the creation of extreme ultraviolet radiation.

In addition, the fuel droplet is caught by a droplet catcher 720 arranged opposite the droplet generator. In other words, the droplet generator and the droplet catcher 720 are arranged at opposite sides of the excitation region 710, and the fuel droplets fed by the droplet generator travels from the droplet generator, to the excitation region 710, and then to the droplet catcher 720. The droplet catcher 720 is configured to catch remaining portions of the fuel droplets fed by the droplet generator, after the fuel droplets have been excited by the laser beam at the excitation region 710.

Furthermore, the generated extreme ultraviolet light is reflected by the collector 730 to an intermediate focus 740. The collector 730 can be configured to reflect extreme ultraviolet light via Bragg's reflection. In some embodiments, the intermediate focus 740 collects the extreme ultraviolet radiation reflected by the collector 730 and transmits the extreme ultraviolet radiation through an illumination system to a photomask. The extreme ultraviolet light is then reflected by the photomask onto a photoresist layer to image a pattern thereon.

During the process of striking the fuel droplet to produce the laser produced plasma and the extreme ultraviolet radiation, contaminants (e.g. fragments of the tin droplet, tin vapor, ions, electrons, and heat) are emitted. In some embodiments, these emitted contaminants are cleaned and shielded by a hydrogen gas flow supplied inside the vacuum chamber 700 by a hydrogen gas supplier 750, so as to protect components inside the extreme ultraviolet light source vessel from being contaminated.

In some embodiments, the hydrogen gas supplier 750 is arranged lower than the excitation region 710, and an evacuation unit 760, such as a vacuum pump, is arranged higher than the excitation region 710. The overall flow direction of the hydrogen gas inside the vacuum chamber 700 is from the hydrogen gas supplier 750 to the evacuation unit 760. As the hydrogen gas flows through the excitation region 710, they may react with the fuel droplets, (e.g. with tin vapor and tin fragments to form $SnH_4$, stannane). Stannane and hydrogen gas carrying contaminants flow toward and are removed by the evacuation unit.

However, not all fuel droplets and contaminants are caught by the droplet catcher 720 or carried away by the hydrogen gas flow, and some contaminants are deposited on the collector 730 to form the debris 910 thereon at a target area 900. The debris 910 gathered on the collector 730 affect the ability of the collector 730 to reflect the generated extreme ultraviolet light toward the intermediate focus 740. Removing the debris 910 from the collector 730 maintains the ability of the collector 730 to reflect extreme ultraviolet radiation to the intermediate focus 740. A suction force can be created at a vacuum opening 201 of a cable 200 for sucking up the debris 910 at the target area 900 from the collector 730. The cable 200 is configured to be able to fit through a droplet generator port 701 of the extreme ultraviolet light source vessel. To assist in sucking objects (e.g. the debris 910 on the collector 730) through the vacuum opening 201 and into the cable 200, a sucking force can be created at the vacuum opening 201 of the cable 200 by lowering pressure inside the cable 200, and fluidly communicating the vessel chamber 700 to an environment having atmospheric pressure.

Figure 3:
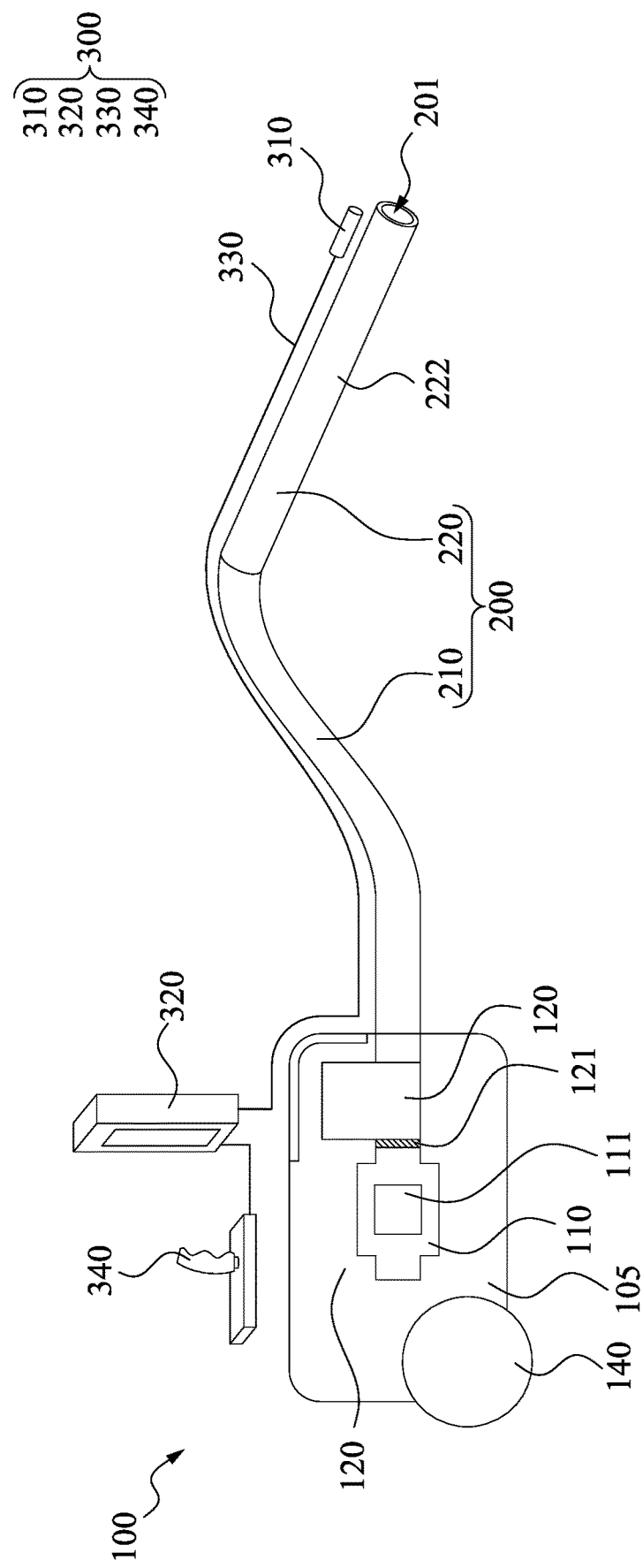
FIG. 3 shows an enlarged view of the apparatus of FIG. 2.

Referring to FIG. 3, in some embodiments, the apparatus 100 of removing the debris 910 from the collector 730 includes a main housing 105, a motor 111, and a cable 200. The main housing 105 is formed with a motor chamber 110, and the motor 111 is accommodated in the motor chamber 110. The cable 200 is attached to the main housing 105, and the interior of the cable 200 is in fluid communication with the motor chamber 110. The cable 200 is formed with a vacuum opening 201 at the end of the cable 200 away from the main housing 105. The motor 111 is configured to pump air away from the cable 200, such that a lower air pressure is created inside the motor chamber 110 and the cable 200, thereby creating a suction force at a vacuum opening 201 of the cable 200 and assisting in sucking objects through the vacuum opening 201 and into the cable 200. In some embodiments, the apparatus 100 further includes a wheel 140 arranged on the main housing 105, a storage unit 120 for collecting the debris 910 sucked up by the cable 200, and a filter 121. The storage unit 120 can be a bag. The storage unit 120 is in fluid communication with the motor chamber 110 and the cable 200, and is arranged between the motor chamber 110 and the cable 200. The filter 121 is arranged between the storage unit 120 and the motor chamber 110 to prevent dangerous dusts from entering the motor chamber 110 and contacting the motor 111. The wheel 140 is rotatably attached to the main housing 105. In some embodiments, the wheel 140 is rotatably attached at an end of the main housing 105 opposite another end of the main housing 105 connected to the cable 200.

Referring to FIGS. 2 and 3, in some embodiments, the debris 910 can be removed from the collector 730 by being sucked up with the apparatus 100. Specifically in some embodiments, the step involves sucking up the debris 910 through the vacuum opening 201 of the cable 200. The closer the vacuum opening 201 is positioned to the target area 900 where the debris 910 is, the greater the suction force is applied to the debris 910 by the vacuum opening 201. Said suction force can be adjusted appropriately by controlling a power supplied to the motor 111.

In some embodiments under such preventive maintenance, the vessel chamber 700 is subjected to atmospheric pressure before sucking up the debris 910 from the collector 730. In other words, the vessel chamber 700 is in fluid communication with the environment such that the pressure threat is substantially equal to the atmospheric pressure. Therefore, the air pressure in the vessel chamber 700 and around the debris 910 is relatively higher than the air pressure inside the cable 200 when the motor 111 is in operation, such that the pressure difference creates an air flow in the direction into the cable 200 through the vacuum opening 201.

In some embodiments, a droplet generator port 701 of the extreme ultraviolet light source vessel is opened such that the cable 200 can be inserted into the vessel chamber 700 through the droplet generator port 701. Furthermore, the droplet generator port 701 can be an opening for fluidly communicating the vessel chamber 700 to the environment and introducing atmospheric pressure into the vessel chamber 700.

Figure 4A:
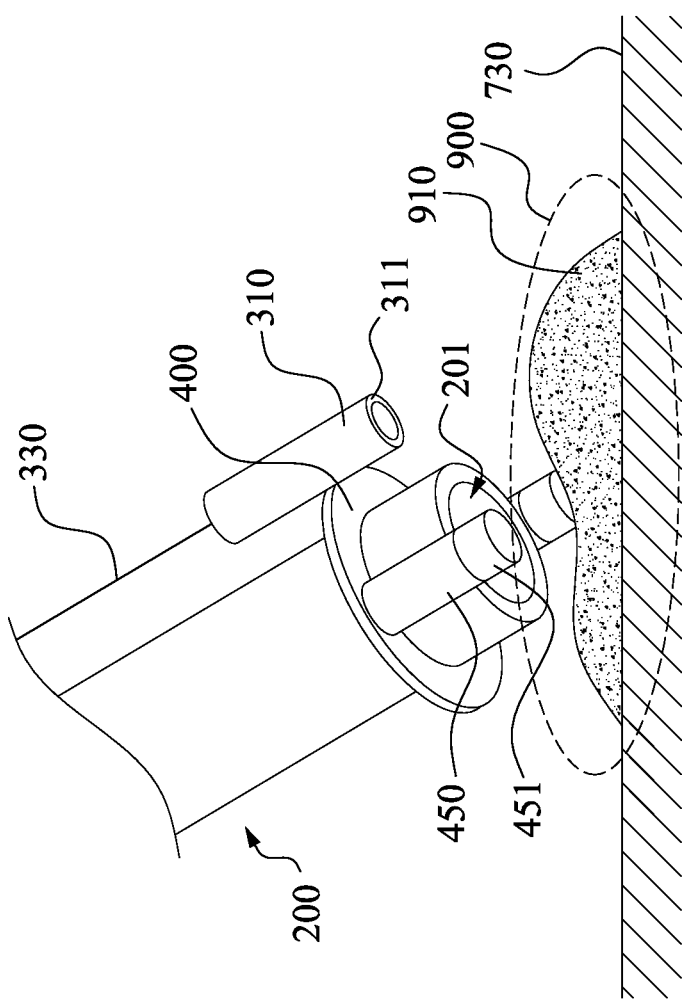
FIGS. 4A and 4B each shows a schematic diagram of a sticky surface and a portion of a cable according to some embodiments of the present disclosure.
Figure 4B:
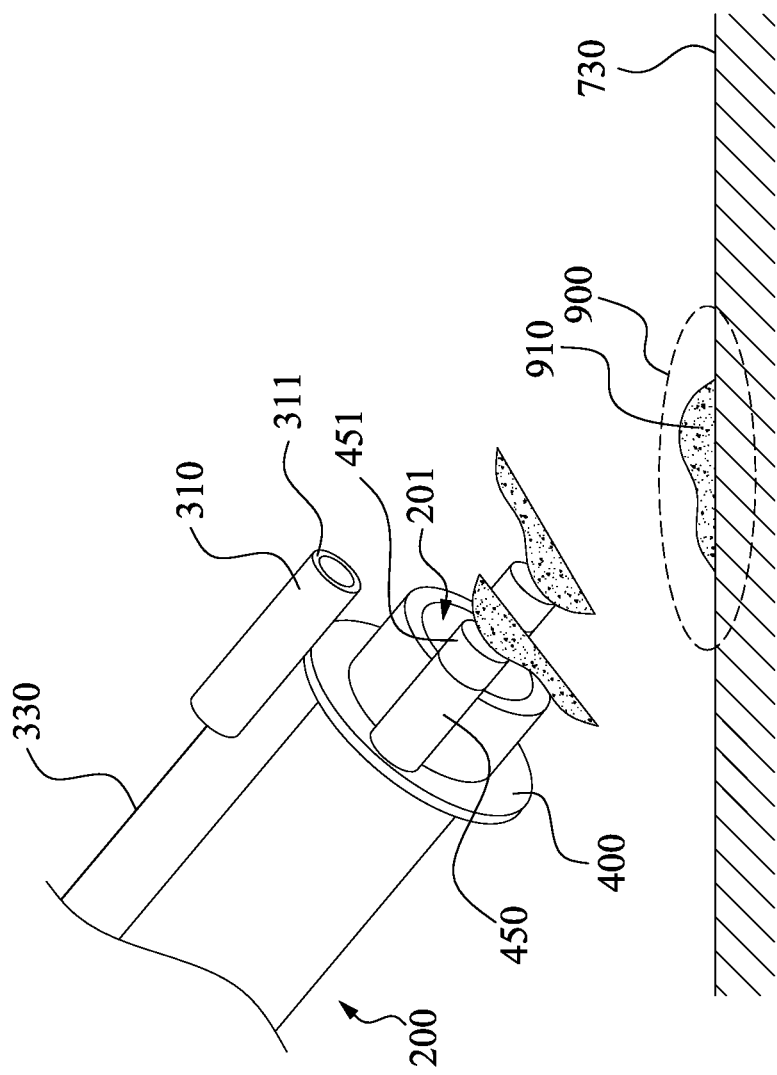

Referring to FIG. 4A, in some embodiments, the debris 910 is removed from the collector by using a sticky surface 451. The sticky surface 451 can be formed on a rod 450, arranged at a position in front and to a side of the vacuum opening 201, and configured to contact an object in front of the vacuum opening 201 of the cable 200 without the cable 200 touching the object. In some embodiment, the debris 910 or the sticky surface 451 has a sticky quality. The sticky surface 451 on the rod 450 is pressed to the debris 910 located at a target area 900, to attach to the debris 910 through contact. Referring to FIG. 4B, in some embodiments, the debris 910 is removed from the collector 730 by removing the sticky surface 451 away from the collector 730. Thereafter, the debris 910 is sucked up from the sticky surface 451 through the vacuum opening 201. The surface 451 can be arranged proximal to the vacuum opening 201 of the cable 200, such that the debris 910 attached on the sticky surface 451 can be sucked up by the vacuum opening 201. In some embodiments, the droplet generator port 701 is opened such that the rod 450 or other elements having the sticky surface 451 can be inserted into the vessel chamber 700 through the droplet generator port 701.

Figure 5A:
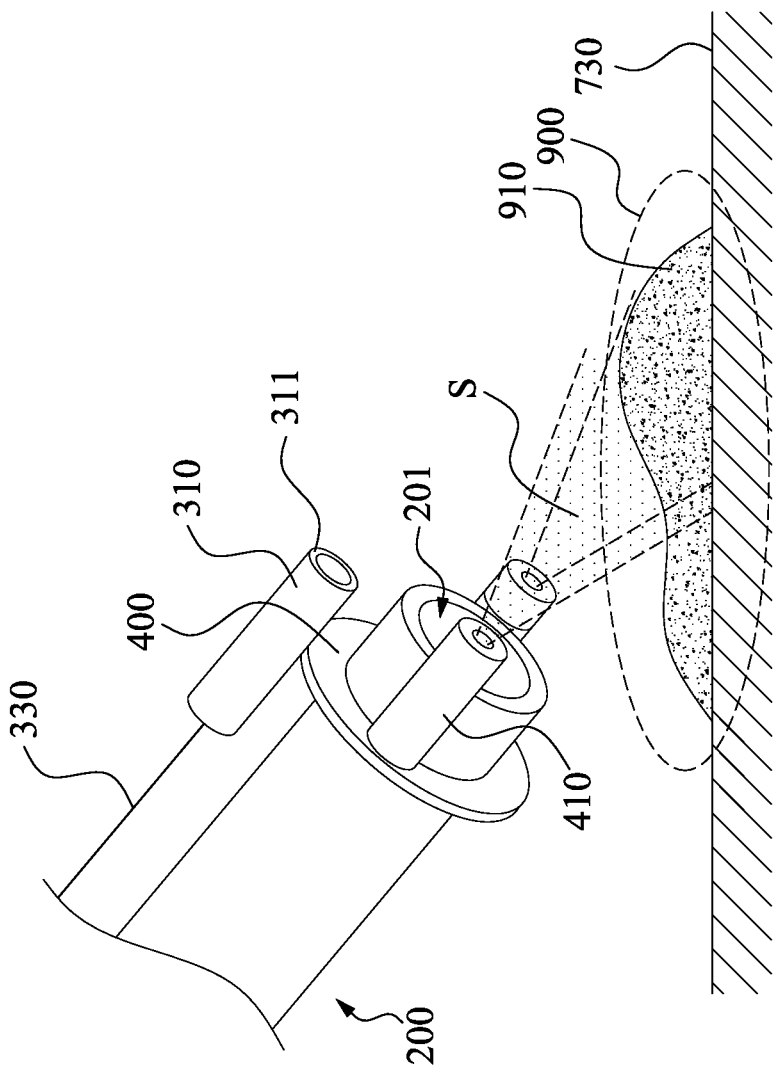
FIGS. 5A, 5B, and 5C each shows a schematic diagram of a solution nozzle and a portion of a cable according to some embodiments of the present disclosure.

Referring to FIG. 5A, in alternative embodiments, a solution S is applied to the debris 910 on the collector 730 before sucking up the debris 910. The solution S can dissolve the debris 910 and weaken the attachment between the debris 910 and the collector 730. Moreover, the solution S can soften the debris 910 such that the rod 450 or the sticky surface 451 can easily stick to the debris 910. In some embodiments, the solution S can be applied through a solution nozzle 410 arranged proximal to the vacuum opening 201, toward the debris 910 located on the collector 730 at the target area 900. For example, the solution nozzle 410 can be arranged at a position in front of and to a side of the vacuum opening 201. The solution nozzle 410 is configured to apply the solution S to the debris 910 on the collector 730.

In some embodiments, the solution S applied to the debris 910 can be a chemical solution, such as a mixture of nitric acid and hydrochloric acid. The chemical solution S can react with the debris 910 for weakening the attachment between the debris 910 and the collector 730, and/or for softening and dissolving the debris 910. In some embodiments, the solution S is in gaseous form. In some embodiments, the solution S is in liquid form and the present disclosure is not limited in this regard.

In some embodiments, the solution S can be a low temperature agent, such as liquid carbon dioxide, and is applied to the tin debris 910. Furthermore, the agent has a slight amount of seeds of gray tin for helping phase change of a crystal structure of the tin debris. Gray tin is referred to as alpha phase tin. The solution S with a low temperature applied to the tin debris 910 can lower the temperature of the tin debris 910, thereby inducing initiation of a phase transformation in the tin. Specifically, beta phase tin is transformed to alpha phase tin. Alpha phase tin is brittle and disintegrates at low temperatures, and is therefore able to be removed from the collector 730.

Figure 5B:
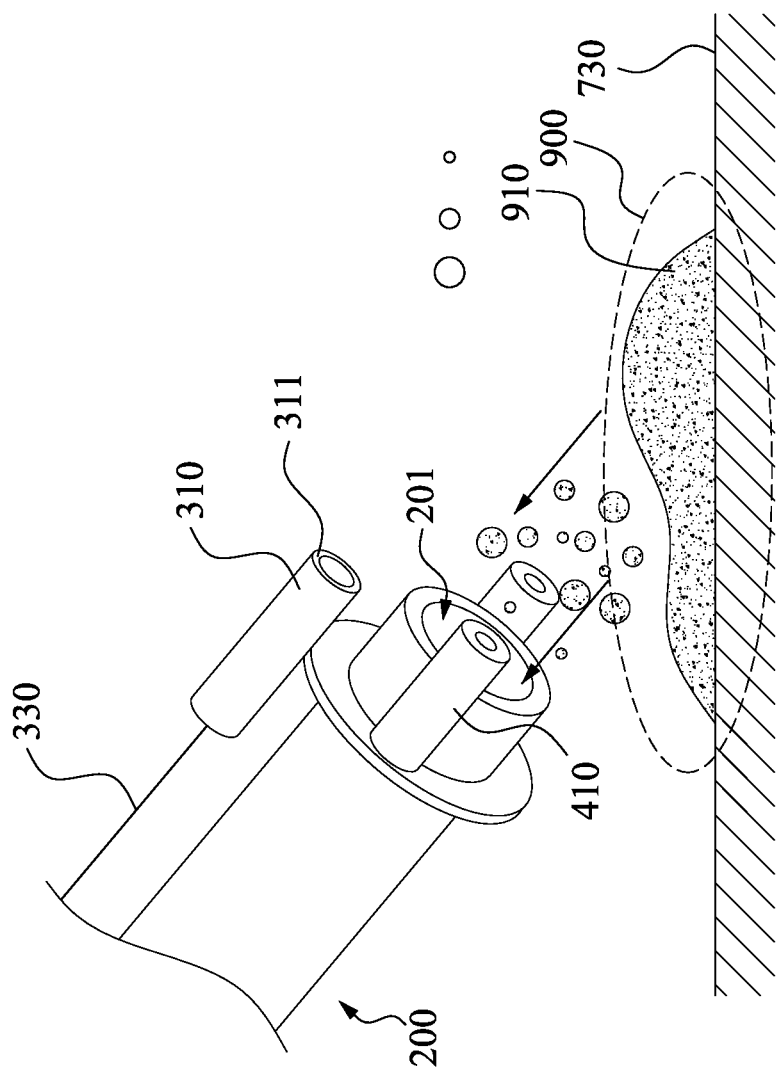

Referring to FIG. 5B, after the debris 910 is applied with the solution S, the debris 910 is then sucked up through the vacuum opening 201. Since the solution nozzle 410 and the vacuum opening 201 are proximal to each other, the cable 200 can be moved by a small amount between a position of applying the solution S to the target area 900 through the solution nozzle 410, and another apposition of sucking up the debris 910 from the target area 900 through the vacuum opening 201. In some embodiments, the debris 910 can be removed from the collector 730 by using the sticky surface 451 after applying the solution S to the debris 910 by using the solution nozzle 410.

Figure 5C:
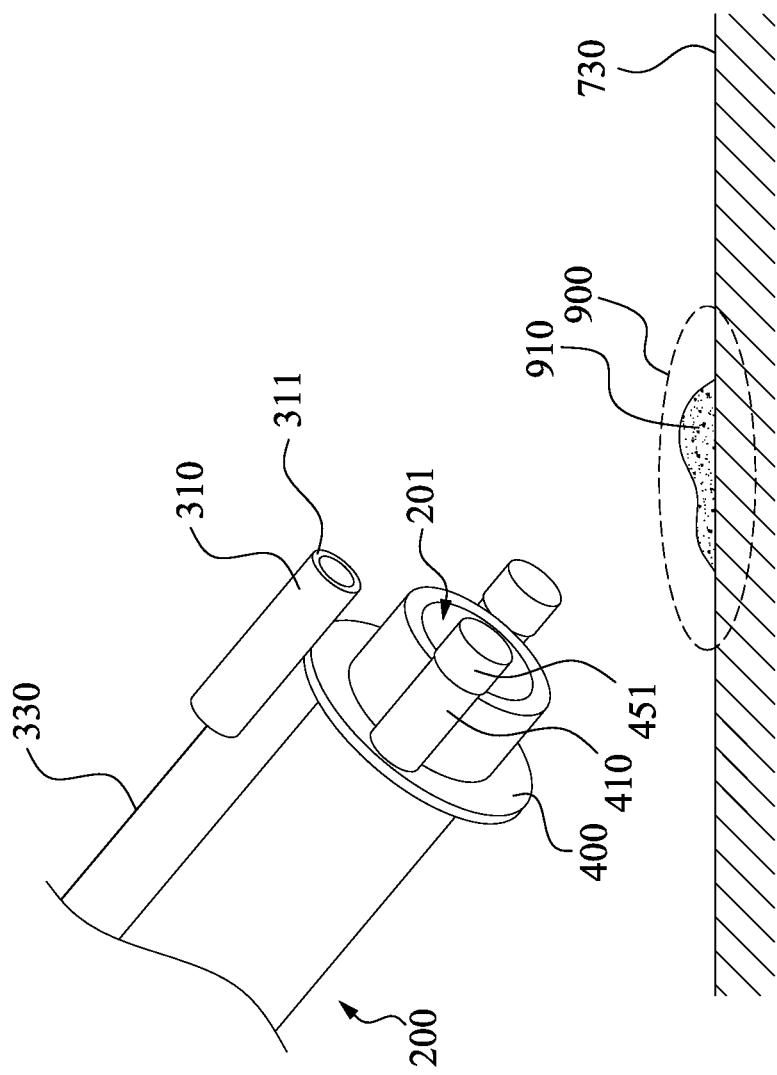

Referring to FIG. 5C, in some embodiments of the present disclosure, the sticky surface 451 is inserted into the solution nozzle 410. The sticky surface 451 can be removably inserted into the solution nozzle 410, such that the sticky surface 451 can be removed when the solution nozzle 410 is to be used.

Figure 6:
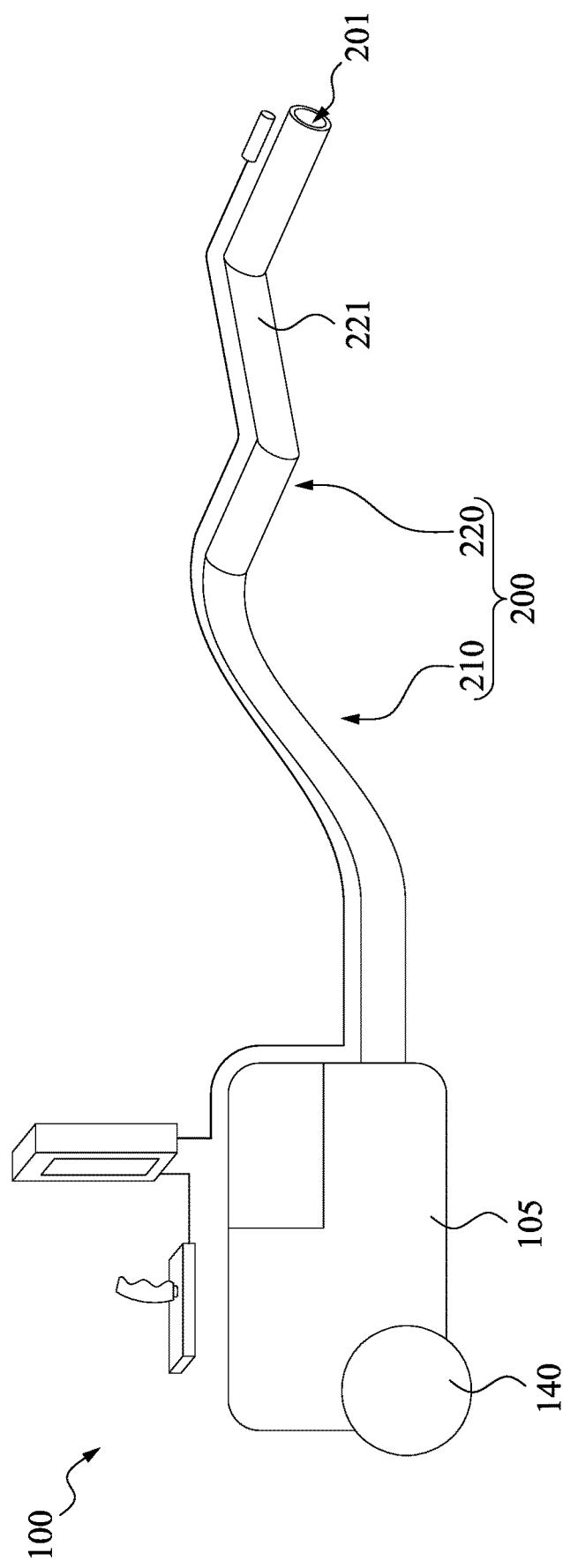
FIG. 6 shows a schematic diagram of an apparatus according to some embodiments of the present disclosure.

Referring to FIG. 3 and FIG. 6, in some embodiments, the cable 200 includes a flexible portion 210 and a rigid portion 220. The flexible portion 210 is connected to the main housing 105 of the apparatus 100, and the rigid portion 220 is connected to the flexible portion 210, and the vacuum opening 201 is formed in the rigid portion 220. The flexible portion 210 connecting the rigid portion 220 to the main housing 105 provides better handling and maneuverability. The rigid portion 220 having the vacuum opening 201 provides stable positioning for targeting the target area. The rigid portion 220 can be an angled section 221, a straight section 222, a combination thereof, or other shapes selected to fit through the droplet generator port 701 of the extreme ultraviolet light source vessel and target the target area 900 of the collector 730 of FIG. 2. In some embodiments, the rigid portion 220 of the cable 200 includes a plurality of rigid sections, so as to form a desired shape for reaching the target area 900 of the collector 730.

Referring again to FIG. 3, in some embodiments, the apparatus 100 further includes a borescope system 300, which includes an object lens 310 and a display unit 320. The object lens 310 is arranged proximal to the vacuum opening 201. In some embodiments, the objects lens 310 is arranged behind the vacuum opening 201, such that the object lens 310 does not get in the way of sucking up the debris 910. Referring to FIG. 4A, in some embodiments, the object lens 310 is arranged proximal to and facing in a direction toward the sticky surface 451, such that an image of the sticky surface 451 can be captured by the object lens 310. Referring to FIG. 5A, in some embodiments, the object lens 310 is arranged proximal to and facing in a direction toward the solution nozzle 410, such that an image of the solution nozzle 410 can be captured by the object lens 310.

Referring back to FIG. 2 and FIG. 3, in some embodiments, an image of the collector 730 is captured. The captured image is displayed at the display unit 320, such that an operator can look at the image and identify the relative position of the vacuum opening 201 with respect to the target area 900 on the collector 730 where the debris 910 is. The operator can therefore accordingly adjust the orientation and positioning of the cable 200 such that the vacuum opening 201 is positioned proximal to the target area 900 for sucking up the debris 910.

Furthermore, referring to FIGS. 4A and 5A, the relative position of the sticky surface 451 with respect to the target area 900, and the relative position of the solution nozzle 410 with respect to the target area 900, can also be identified. The operator can therefore accordingly adjust the orientation and positioning of the cable 200 such that the sticky surface 451 and/or the solution nozzle 410 are positioned to target the debris 910 in the target area 900. In some embodiments, the borescope system 300 further includes a lighting unit 311. The lighting unit 311 can be arranged on the cable 200 and proximal to the vacuum opening 201, and directed in a direction substantially similar to the direction which the vacuum opening 201 is facing. In some embodiments, the lighting unit 311 can be arranged at the periphery of the object lens 310. By this configuration, the lighting unit 311 may face the same direction as the object lens 310. The lighting unit 311 can be used to illuminate the collector 730 such that a clearer image of the collector 730 can be captured and displayed by the display unit 320 of the borescope system 300. The lighting unit 311 can be a light source itself, or receive light transmitted in a line 330 from another light source.

Referring again to FIG. 3, in some embodiments, the borescope system 300 further includes the line 330 connecting the object lens 310 to the display unit 320. In some embodiments, the line 330 is arranged along the length of the cable 200 and fastened to the cable 200. In some embodiments, the line 330 is an optical fiber configured to transmit light. The captured image is optically transmitted through the line 330 arranged along the length of the cable 200, to a processor inside or proximal to the display unit 320. The processor processes the captured image and displays the image at the display unit 320. Alternately in some embodiments, the line 330 is a wire configured to transmit digital information. The captured image is processed locally at a processor next to the object lens 310, and then transmitted digitally through the line 330 arranged along the length of the cable 200, to the display unit 320 for display.

In some embodiments, the orientation and position of the object lens 310 inside the vessel chamber of FIG. 2 can be adjusted by adjusting the orientation and position of the rigid portion 220 of the cable 200. When the vacuum opening 201 of the rigid portion 220 is aligned with the target area 900, the object lens 310 can capture an image of the target area 900. In this manner, the target area 900 of the collector 730 can be identified, and the relative position of the vacuum opening 201 with respect to the target area 900 can be determined.

In some embodiments of the present disclosure, the borescope system 300 further includes a remote control 340 for adjusting the orientation of the object lens 310. In some embodiments, the line 330 further includes a wire for transmitting control signals from the remote control 340 to the object lens 310. The orientation of the object lens 310 with respect to the rigid portion 220 of the cable 200 can be adjusted, such that the orientation of the objects lens 310 can be adjusted without moving the cable 200 for capturing an image of the target area 900. In this manner, the target area 900 of the collector 730 can be identified without aligning the vacuum opening 201 to the target area 900, thereby expediting the process of identifying the relative position of the vacuum opening 201 with respect to the target area 900. Instead of repositioning and moving the cable 200 inside the vessel chamber 700 to find the target area 900, the object lens 310 can be adjusted orientation-wise to find the target area 900, which is cost effective and less time consuming.

Additionally, by adjusting the orientation of the object lens 310 with respect to the rigid portion 220 of the cable 200, the object lens 310 can be oriented according to the relative positions of the vacuum opening 201 and the target area 900, such that an image of the target area 900 can be captured by the object lens 310 when the debris 910 is being sucked up through the vacuum opening 201, when the debris 910 is being pressed to the sticky surface 451 as shown in FIG. 4A, and/or when the solution is being applied to the debris 910 through the solution nozzle 410 as shown in FIG. 5A.

Figure 7A:
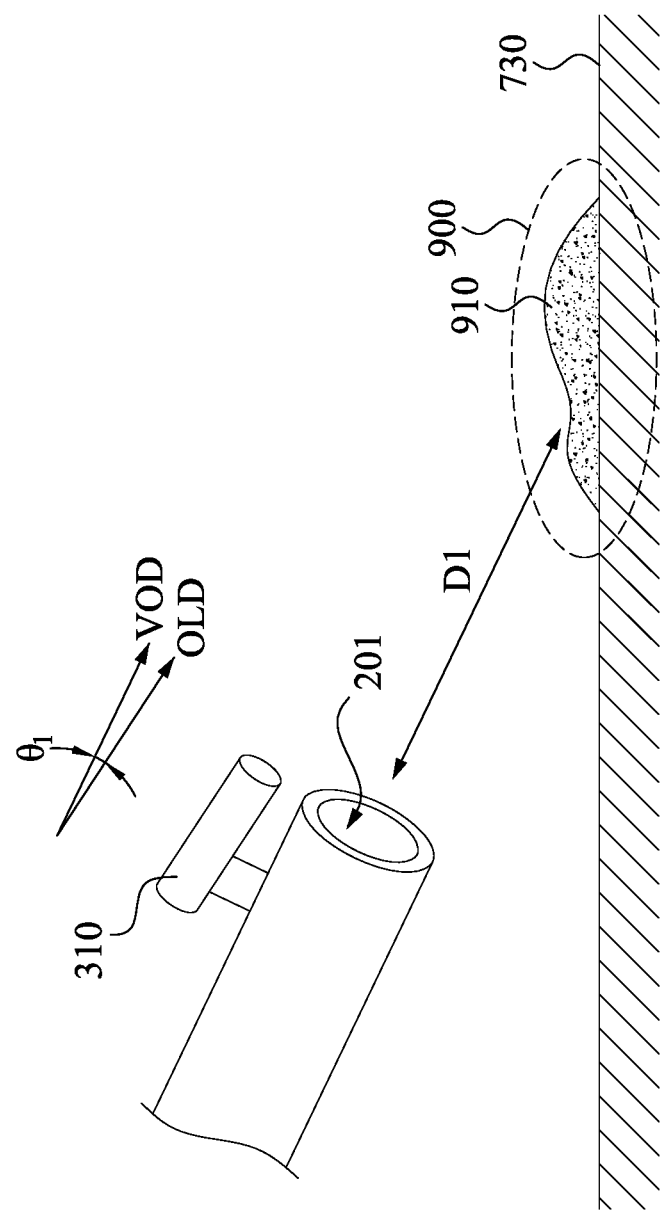
FIGS. 7A and 7B each shows a schematic diagram of a cable and an object lens positioned proximal to a target area according to some embodiments of the present disclosure.
Figure 7B:
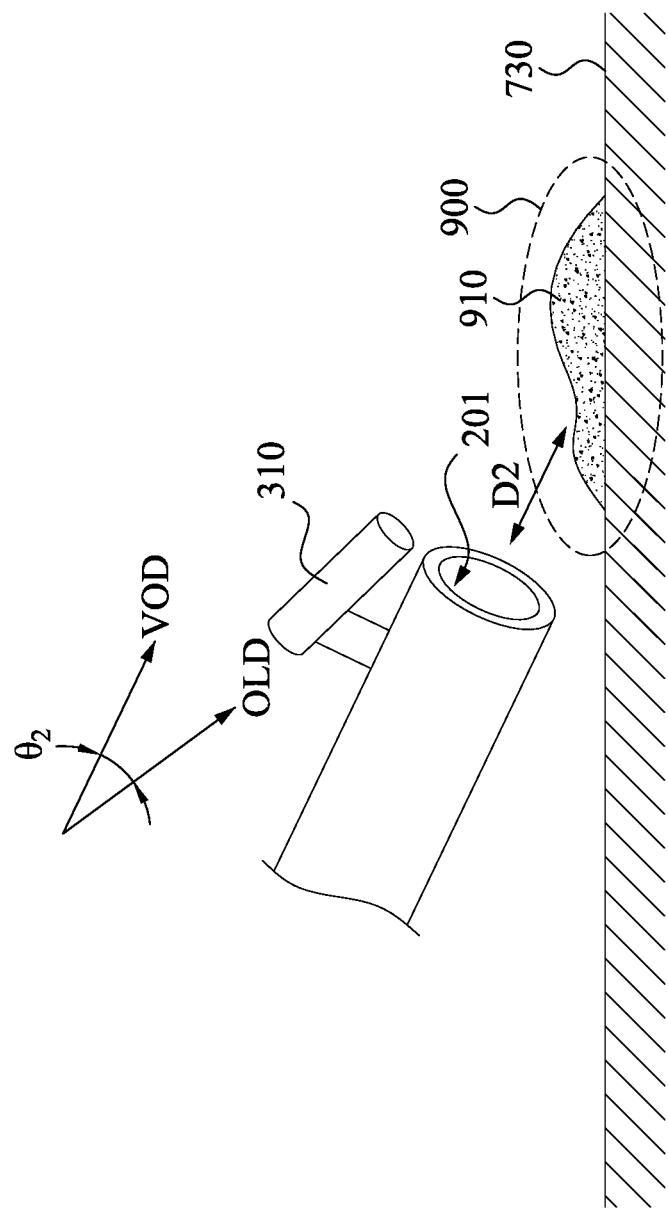

Referring to FIG. 7A, a distance D1 is between the vacuum opening 201 and the target area 900. The object lens 310 is accordingly oriented such that an angle $\theta_1$ is included between an object lens direction OLD and a vacuum opening direction VOD, and the object lens 310 faces toward and captures an image of the target area 900. Referring to FIG. 7B, a distance D2 is between the vacuum opening 201 and the target area 900 and smaller than the distance D1. The object lens 310 is accordingly oriented such that an angle $\theta_2$ is included between the object lens direction OLD and the vacuum opening direction VOD, and the object lens 310 faces toward and captures an image of the target area 900. Generally, the greater the distance between the vacuum opening 201 and the target area 900, the smaller the included angle between the object lens direction OLD and the vacuum opening direction VOD is configured for the object lens 310 to face toward the target area 900.

Figure 8:
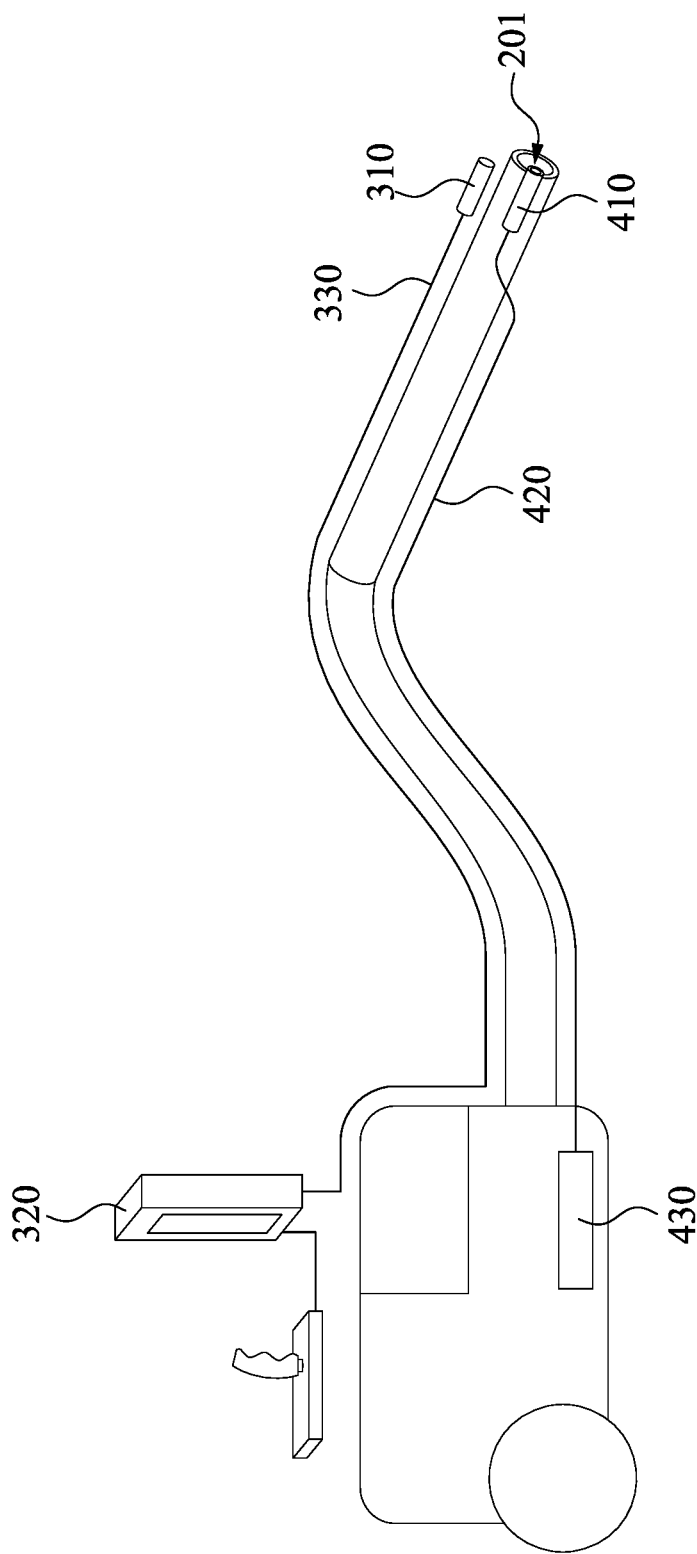
FIG. 8 shows a schematic diagram of an apparatus according to some embodiments of the present disclosure.

Referring to FIG. 8, in some embodiments, a solution source 430 is arranged in the main housing 105 of the apparatus 100, and a tube 420 connects the solution source 430 to the solution nozzle 410.

Referring to FIGS. 4A and 5A, the object lens 310 of the borescope system 300, the sticky surface 451, and/or the solution nozzle 410 can be removably attached to the rigid portion 220 of the cable 200. In some embodiments of the present disclosure, the object lens 310, the sticky surface 451, and the solution nozzle 410 are removably attached to a removable unit 400, which in turn removably sleeves the rigid portion 220 of the cable 200. By removing the removable unit 400 from the rigid portion 220 of the cable 200, all of the object lens 310, the sticky surface 451, and the solution nozzle 410 are removed from the rigid portion 220 in one act. The object lens 310, the sticky surface 451, and the solution nozzle 410 can be separately attached to and removed from the removable unit 400. Thereby, the object lens 310, the sticky surface 451, and the solution nozzle 410 can be selectively attached to and removed from the rigid portion 220 separately, or together.

The present disclosure presents several features, such as the cable having a vacuum opening, the sticky surface, and the solution nozzle, for assisting in the removal of the debris from the collector. The vacuum opening is configured to suck up the debris from the collector. The sticky surface is configured to be pressed to the debris and remove the debris through sticky attachment. The solution nozzle is configured to apply solution that separates the debris from the collector. Removing the debris from the collector maintains the ability of the collector to reflect extreme ultraviolet radiation toward the intermediate focus, such that the efficiency of the extreme ultraviolet photolithography process is maintained. The borescope system and the interchangeable rigid portion of the cable allows the abovementioned features (e.g. vacuum opening, sticky surface, solution nozzle) to be efficiently targeted to the target area on the collector where the debris is.

According to embodiments of the present disclosure, a method includes providing a fuel droplet into a vessel chamber; striking the fuel droplet with a laser beam at an excitation region to generate a plasma that emits extreme ultraviolet radiation, in which debris from the plasma is deposited on a collector under the excitation region; and sucking up the debris from the collector.

According to embodiments of the present disclosure, a method includes providing a fuel droplet into a vessel chamber; striking the fuel droplet with a laser beam at an excitation region to generate a plasma that emits extreme ultraviolet radiation, wherein debris from the plasma is deposited on a collector under the excitation region; and removing the debris from the collector using a sticky surface.

According to embodiments of the present disclosure, an apparatus includes a main housing, a motor, a cable, and a borescope system. The motor is in the main housing and configured to pump air. The cable is connected to the main housing and formed with a vacuum opening. The borescope system has an object lens arranged on the cable proximal to the vacuum opening, a display unit, and a line connecting the object lens and the display unit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a fuel droplet into a vessel chamber;
   striking the fuel droplet with a laser beam at an excitation region to generate a plasma that emits extreme ultraviolet radiation, wherein debris from the plasma is deposited on a collector under the excitation region; and
   sucking up the debris from the collector, and comprising:
      removing the debris from the collector by using a sticky surface; and
      sucking up the debris from the sticky surface.
2. The method of claim 1, further comprising:
   applying a solution to the debris prior to sucking up the debris from the collector.
3. The method of claim 2, wherein the solution comprises nitric acid and hydrochloric acid.
4. The method of claim 2, wherein the debris includes tin, and the solution is an agent for lowering a temperature of the debris and initiating a phase change in a crystal structure of the tin.
5. The method of claim 2, wherein the solution is in liquid form.
6. The method of claim 2, wherein the solution is in gaseous form.
7. The method of claim 2, wherein the solution is liquid carbon dioxide for lowering a temperature of the debris.
8. The method of claim 1, further comprising:
   illuminating the collector.
9. The method of claim 1, further comprising:
   capturing an image of the collector;
   adjusting the image captured on the collector; and
   capturing an image of a target area, wherein the debris is in the target area.
10. The method of claim 9, wherein sucking up the debris from the collector is performed using a vacuum opening; and further comprising:
    adjusting a position of the vacuum opening according to the captured image of the target area.
11. The method of claim 1, further comprising:
    inserting a vacuum opening into the vessel chamber through a droplet generator port, wherein sucking up the debris from the collector is performed using the vacuum opening.
12. The method of claim 1, further comprising:
    applying a hydrogen gas to the fuel droplet prior to sucking up the debris from the collector.
13. A method, comprising:
    striking a fuel droplet with a laser beam in a vessel chamber to generate a plasma, wherein debris from the plasma is deposited on a collector inside the vessel chamber;
    applying a solution to the debris from a solution nozzle, wherein the solution is in liquid form; and
    sucking up the debris from the collector after applying the solution to the debris.
14. The method of claim 13, wherein the solution is liquid carbon dioxide for lowering a temperature of the debris.
15. The method of claim 13, further comprising:
    capturing an image of the collector by using an object lens; and
    positioning the solution nozzle to target the debris according to the image of the collector captured by using the object lens.
16. A method, comprising:
    striking a fuel droplet with a laser beam in a vessel chamber to generate a plasma, wherein debris from the plasma is deposited on a collector inside the vessel chamber;
    capturing an image of the collector by using an object lens arranged proximal to a vacuum opening of a cable;
    adjusting a positioning of the vacuum opening of the cable according to the image of the collector captured by the object lens; and
    sucking up the debris from the collector through the vacuum opening of the cable.
17. The method of claim 16, further comprising:
    displaying the captured image of the collector at a display unit.
18. The method of claim 16, further comprising:
    illuminating the collector.
19. The method of claim 16, further comprising:
    adjusting an orientation of the vacuum opening of the cable according to the image of the collector captured by the object lens.
20. The method of claim 16, further comprising:
    capturing an image of a target area, wherein the debris is in the target area.

* * * * *